US006970752B1

(12) United States Patent
Lim et al.

(10) Patent No.: US 6,970,752 B1
(45) Date of Patent: Nov. 29, 2005

(54) METHOD AND APPARATUS FOR DETECTING SWITCH CLOSURES

(75) Inventors: Teck Chye Allen Lim, Singapore (SG); Khiam Yong Tan, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/573,987

(22) Filed: May 17, 2000

(51) Int. Cl.[7] ............................ G06F 17/00; H02B 1/00
(52) U.S. Cl. ........................................ 700/94; 381/123
(58) Field of Search ................................ 381/122, 123, 381/74, 26, 81, 85, 91, 111, 367, 370, 375, 381/376, 384; 379/421–424, 430, 434, 433.06, 379/236, 93.08; 455/575.2; 369/30.26, 30.27; 700/94

(56) References Cited

U.S. PATENT DOCUMENTS

| 4,488,196 | A | * | 12/1984 | Takenaga et al. ............ 360/137 |
| 4,583,189 | A | * | 4/1986 | Koyama ...................... 708/142 |
| 4,918,634 | A | * | 4/1990 | Nishimori ................... 708/142 |
| 4,939,511 | A | * | 7/1990 | Hinckley ................ 340/825.78 |
| 5,001,774 | A | * | 3/1991 | Lee ........................... 455/151.1 |
| 5,475,659 | A | * | 12/1995 | Aoki ........................ 369/24.01 |
| 5,481,595 | A | * | 1/1996 | Ohashi et al. ............ 379/88.27 |
| 5,598,463 | A | * | 1/1997 | Saccardo et al. ......... 379/93.26 |
| 5,619,196 | A | * | 4/1997 | Escobosa ...................... 341/22 |
| 5,748,576 | A | * | 5/1998 | Kondo et al. ............. 369/30.09 |
| 6,212,409 | B1 | * | 4/2001 | Matsuo et al. .............. 455/566 |
| 6,314,331 | B1 | * | 11/2001 | D'Agosto, III .............. 700/94 |
| 6,453,371 | B1 | * | 9/2002 | Hampson et al. ............. 710/37 |
| 6,459,911 | B1 | * | 10/2002 | Hijii ........................... 455/563 |
| 6,470,197 | B1 | * | 10/2002 | Tuoriniemi et al. ....... 455/575.2 |
| 6,577,250 | B1 | * | 6/2003 | Yee ............................... 341/26 |

FOREIGN PATENT DOCUMENTS

| JP | 05091584 | A | * | 4/1993 | ............ H04R 1/10 |
| JP | 06165278 | A | * | 6/1994 | ............ H04R 1/04 |
| JP | 10023115 | A | * | 1/1998 | ........... H04M 1/00 |
| JP | 10215300 | A | * | 8/1998 | ........... H04M 1/00 |

* cited by examiner

Primary Examiner—Xu Mei

(57) ABSTRACT

An apparatus and method for detecting the closure of one of several switches using a single input line of a detector is disclosed. The input line is also used to carry an audio-frequency signal when a recording switch is closed. The switches are connected to a network of resistors that cooperate with a pull-up resistor to form a voltage divider. The pull-up resistor is connected to the input line. The switches are closed to selectively switch resistors in the network out of the voltage divider to change the voltage on the input line. A detector reads the voltage on the input line and compares it with a set of predetermined values to determine which switch is closed. If a recording switch is closed, a microphone connected to the network of resistors converts sound to an audio-frequency signal onto the input line.

21 Claims, 3 Drawing Sheets

METHOD AND APPARATUS FOR DETECTING SWITCH CLOSURES

FIELD OF INVENTION

This invention relates to a method and apparatus for detecting closure of one of several switches using one input pin. More particularly, this invention relates to detecting the closure of one of several switches using one input pin of a microprocessor and subsequently using the same input pin to receive audio frequency signals if a particular recording switch is detected to be closed.

BACKGROUND

In the prior art, usually more than one input line of a microprocessor or microcontroller is required for the detection of closure of one of two or more switches. Generally, a keypad having $n^2$ buttons or switches arranged in an n×n matrix will require 2N number of input/output lines for decoding switch closures on the keypad. For example a two-by-two keypad requires four input and output (I/O) lines for determining a key press and a three-by-three keypad requires six I/O lines. Such a matrix configuration works if the required number of I/O lines is available. However it is not always possible to provide the required number of I/O lines due to either space or cost constraints.

Examples of devices where cost and size are important design considerations are portable music playback devices such as CD players and more recently palm-sized personal computer (P/PC). As these devices are meant to be carried around, it is highly desirable to reduce the size of these devices. Reducing the number of I/O lines required is one way of achieving a smaller device.

Another factor which dictates that less I/O lines be used in such devices is the types of standard jacks available for connecting a pair of earphones to the device. Standard jacks are either of the three or four-pole types. A three-pole jack has three sections or poles, two of these poles are used for the left and right sound channels and the last pole for a ground (GND) connection. Such a three-pole jack suffices for connecting a pair of stereo earphones to the device. To support anything more than the pair of stereo earphones, more connections than what a three-pole jack can support are required.

For example, 4-pole jacks have become a standard part when remote controls are introduced. When used to play music, these devices are usually carried on the waist or in a bag rendering the control buttons on the device difficult to access. To increase usability, manufacturers of these devices have introduced a remote control which is attached to the wires connecting the earphones to the device. This remote control is small in size and has a few control buttons—play, stop, forward and reverse. When a user puts on the earphones, the remote control is conveniently located at chest level and therefore allows the user easy access.

With a recording device such as a P/PC, it will also be convenient to locate a microphone on the remote control. With the microphone added onto the remote control, more connections are required to the device. These connections would require jacks to have more than four poles, preferably five poles. However, five-poles jacks are currently non-standard and would have to be specially manufactured. Cost involved in tooling such a non-standard jack is prohibitive. One possible solution is to use two separate standard jacks to support the combination of the remote control, the earphones and the microphone. However, such a solution would impede the usability of the device and would require more space on the device than would a single jack.

From the foregoing, the prior art therefore has a need for an innovative method and apparatus for detecting the closure of one of a plurality of switches using one input pin. The method also uses the same input pin to receive an audio frequency signal after detecting that a particular recording switch is closed. With this apparatus, a standard four-pole jack will be sufficient for connecting a remote control, a pair of earphones and a microphone to an audio recording and playback device. It is advantageous to use such a four-pole jack as the device would then be able to operate with a pair of earphones that is attached to a standard three-pole jack.

SUMMARY

In accordance with a preferred embodiment, an apparatus for detecting the closure of one of several switches using a single input line of a detector has a voltage generator and a comparator. The voltage generator is configured to be responsive to a switch closure for generating a predetermined output voltage on the input line. The detector has a comparator that receives the output voltage on the input line and determines which one of the several switches is closed.

Preferably, the comparator has an analog-to-digital converter (ADC) and a microprocessor. The ADC converts the output voltage on the input line to a digital voltage value. The microprocessor compares the digital voltage value with a set of predetermined values to determine which switch is closed. Preferably, the voltage generator is a voltage divider that has a first resistance connected to a second resistance at a control node. The control node is connected to the input line. In one embodiment, the second resistance is derived from a network of resistors connected in series. The switches are connected to these resistors to selectively switch resistors out of the second resistance to change the second resistance. With the change in the second resistance, the voltage at the control node also changes.

Optionally, the apparatus further includes a microphone for converting sound to an audio-frequency signal onto the input line. This microphone is connected to the network of resistors to form the second resistance. The apparatus also includes a third resistance that can be connected across the first resistance to produce a lower overall resistance across the first resistance. This lower resistance across the first resistance raises the voltage on the input line to appropriately bias the microphone.

The voltage divider and the microphone are preferably contained in a remote control housing separate from the detector. The microphone is connected to the detector using a cable which includes the input line.

In another aspect of the present invention, a remote control and earphones set that forms part of the earlier described apparatus has a four-pole jack, a remote control and a pair of earphones. The set is connected to a device that includes the detector using the four-pole jack. The remote control is coupled to the four-pole jack. The remote control includes the voltage divider described above. The four-pole jack carries audio signals from the device for playing back on the earphones. Preferably, the remote control is directly coupled to the four-pole jack, and the earphones are coupled to the four-pole jack via the remote control.

Also in accordance with the preferred embodiment, the present invention provides a method of detecting the closure of one of several switches using the apparatus described above. The method involves generating a predetermined voltage on the input line when a switch is closed. The method further converts the predetermined voltage received on the input line to a digital voltage value. The method also measures the voltage of a battery used to power the apparatus. After measuring the battery voltage, the method selects a set of predetermined voltages that corresponds to the battery voltage. The method then compares the digital voltage value with the selected set of predetermined voltages to determine which switch is closed. When a recording switch is detected to be closed, the method changes the voltage on the input line to appropriately bias the microphone such that an audio-frequency signal is received substantially undistorted on the input line.

BRIEF DESCRIPTION OF DRAWINGS

The invention will be better understood with reference to the following drawing, in which.

DETAILED DESCRIPTION OF THE PREFERRED EMBODIMENT

Hereafter, a preferred embodiment of the present invention will be described in the context of a palm-sized personal computer (P/PC) equipped with a remote control. However, it is to be understood that the invention is equally applicable to other types of computing devices or electronic devices wherein a single input/output (I/O) pin is used for detecting depression or closure of one of several buttons or switches and for the receiving of audio frequency signals from a microphone if it is detected that a recording switch is closed.

Figure 1:
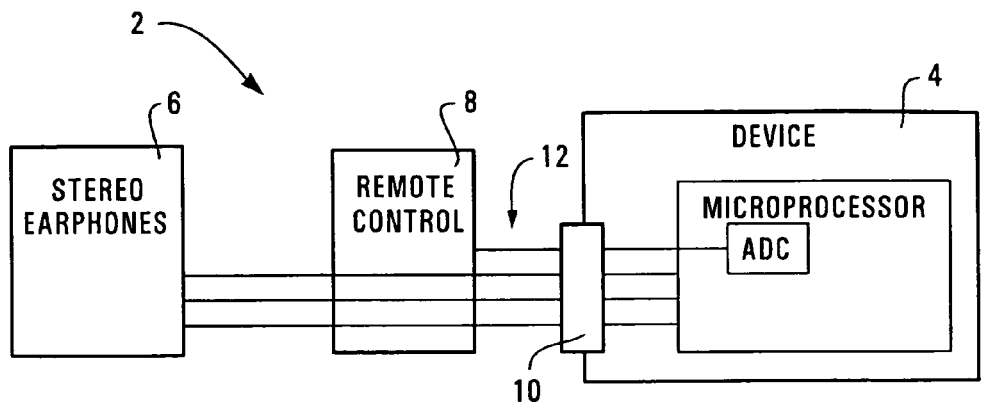
FIG. 1 is a block diagram of palm-sized personal computer (P/PC) having a device, a remote control and a pair of earphones.

FIG. 1 is a block diagram of a P/PC system 2 which is capable of recording and playing back audio frequency signals which are digitally stored in a suitable format such as the MP3 format. The system 2 includes a P/PC device 4, a pair of stereo earphones 6 and a remote control 8. The remote control is electrically coupled to a four-pole jack 10 using a cable 12. The stereo earphones 6 are preferably electrically coupled to the four-pole jack 10 via the remote control 8. When connected to a corresponding four-pole socket on the device 4, the four-pole jack carries a left-channel and a right-channel audio signal from the device 4 for playback on the earphones 6, a ground (GND) signal and a control signal for input into the device 4. The length of the cable 12 is chosen such that when a user wears the earphones 6, the remote control 8 is approximately at the chest level of the user. Such a positioning of the remote control 8 allows the user to easily access the remote control 8. On the remote control 8 are five buttons or switches S1–S5 (FIG. 2) for performing functions common to audio recording and playback devices. The switches are designated RECORD, PLAY, STOP, FORWARD and BACKWARD.

Figure 2:
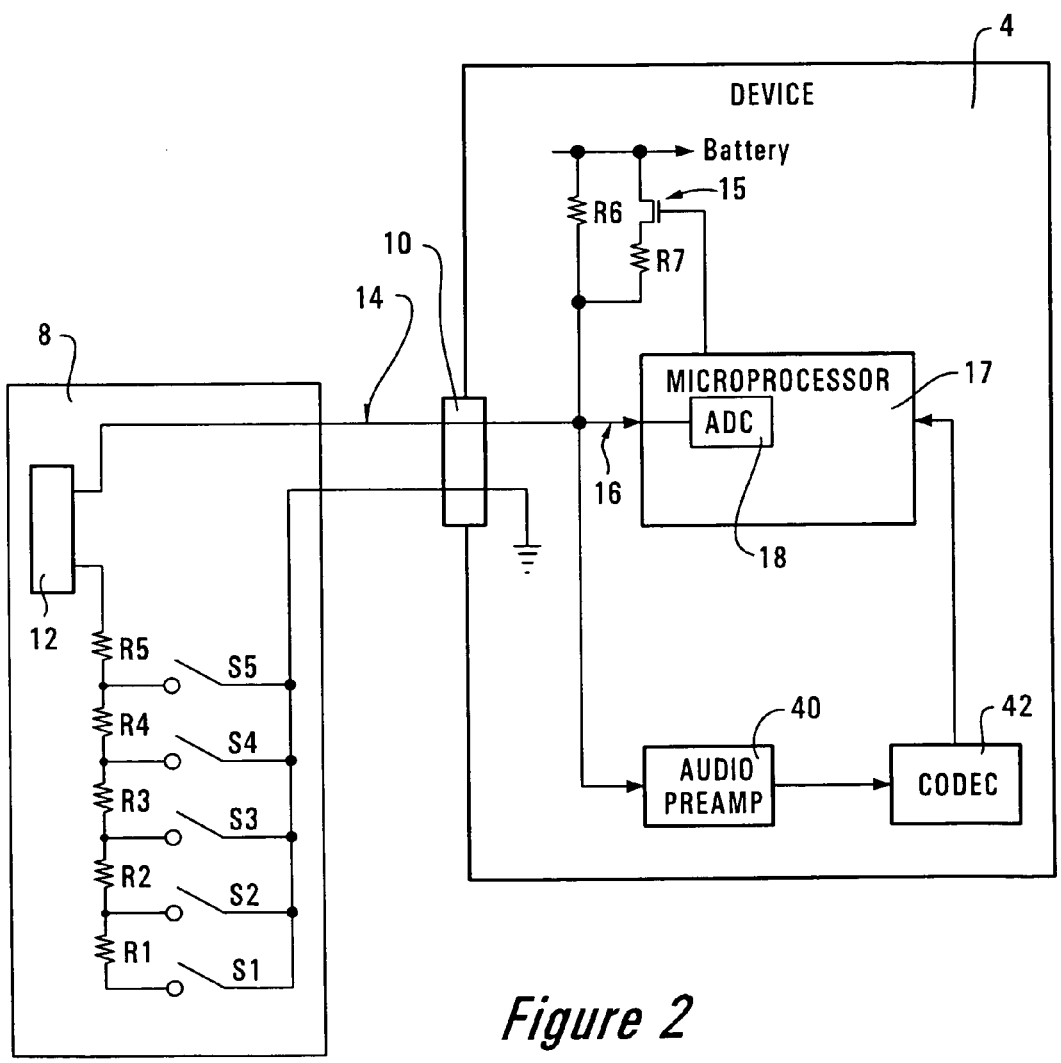
FIG. 2 is a block diagram similar to FIG. 1 showing the electronic hardware in the remote control and the device according to a preferred embodiment of the present invention. The remote control is shown connected to the device at a control node. The remote control has several switches and a microphone for audio recording.

FIG. 2 is a schematic diagram showing the connections between the remote control 8 and the device 4. According to the preferred embodiment of the invention, a network of five resistive elements such as resistors R1–R5 are connected in series in the remote control 8. This series of resistors R1–R5 are preferably connected in series with a microphone 12. A free end of the microphone 12 is connected to a pole of the four-pole jack 10. On the device end of this connection is a pull-up resistive element, such as a resistor R6. Resistor R6 is connected to a battery for powering the device 4. This pull-up resistor R6 together with the microphone 12 and resistors R1–R5 form a voltage divider. The connection point between the microphone 12 and the pull-up resistor R is designated a control node 14. The voltage divider acts as a voltage generator for generating a control voltage on this control node 14. Five switches S1–S5 are electrically coupled to the series of resistors R1–R5 such that closure of the switches is able to cause predetermined voltages to be generated at the control node 14. The switches S1–S5 are preferably of the bi-state push button type which is normally open and held down to be closed. In the preferred embodiment, such a switch connection can be realized by connecting one end of each switch S1–S5 to GND and the other end of each switch to interconnection nodes between the resistors R1–R5. When all the switches S1–S5 are open, none of the resistor R1–R5 is connected to GND. The resistor R6 in the device 4 pulls the control node 14 to the battery voltage. When the switch S5 is closed, resistors R1–R4 are excluded from the voltage divider to leave only resistor R5 in the voltage divider. This resistor R5 in the voltage divider will result in a predetermined minimum voltage to be dropped or generated at the control node 14. Similarly, when only the switch S4 is closed, resistors R1–R3 are excluded and only resistors R4 and R5 are left in the voltage divider. The voltage of the control node 14 changes similarly with the closures of the other switches S1–S3. If only the switch S1 is closed, all the resistors R1–R5 will form part of the voltage divider to cause a predetermined maximum voltage to drop at the control node 14.

If more than one switch is closed in such a configuration of the switches S1–S5, the switch which leaves the least number of resistors R1–R5 to form the voltage divider will be detected to be a dominant switch. For example, if switches S3 and S5 are closed simultaneously, only resistor R5 remains in the voltage divider since switch S5 connects the resistor R5 to GND, excluding resistors R1–R4 from the voltage divider even though the switch S3 is also closed. Such a configuration of the switches and resistors allows the more dominant switches to be designated as switches for activating more important functions. In this preferred embodiment, the switch S5 is designated for activating a recording function. This recording function is viewed as most important and should pre-empt the other functions if activated. Similarly, it is preferable that the other switches S4–S1 are designated for activating a playback, stop, forward and backward function in descending order of priority.

An interface to the control node 14 in the device 4 for detecting switch closures is next described. On the device side, the control node 14 is electrically coupled via an I/O line to an I/O pin 16 of a SH3 microprocessor 17 available from Hitachi. This I/O pin 16 serves two purposes—an interrupt and an input to an analog-to-digital converter (ADC) 18 on the microprocessor 17. There are several design objectives to be met when designing the electronic hardware of the present invention. The first objective is to have an ability to bring the microprocessor 17 out of a power saving mode such as the light-sleep and deep-sleep mode on the SH3 microprocessor 17 when one of the switches S1–S5 is closed. Given that the closure of the switch S1 generates the highest voltage at the control node 14, the value of resistors R1–R7 have to be selected to ensure that the voltage generated at the control node 14 is sufficiently low to interrupt the microprocessor 17 to cause it to run an interrupt service routine or interrupt handler. The voltage at the control node 14 should be less than half of the battery level to be able to cause an interrupt in the microprocessor 17. This voltage is dependent on the semiconductor technology that is used to build the microprocessor.

Another design objective is that the device 4 should be able to support a standard pair of stereo earphones that comes with a standard three-pole jack. When such a three-pole jack is inserted into a socket for receiving a standard four-pole jack, the GND pole will connect the GND and CONTROL poles thereby shorting the control line to GND. In such a situation, only the resistor R6 in the voltage divider is connected across the battery. This resistor R6 is therefore selected to be of a high resistance to reduce current drain of the battery when the three-pole jack is inserted in the socket for a four-pole jack.

After the value of resistor R6 is determined, the values of the resistors R1–R5 are determined next. The total resistance of the microphone and the resistors R1–R5, are previously explained, must result in a voltage of less than half the battery voltage at the control node 14. In the preferred embodiment, this voltage at the control node is chosen to be approximately 1V. It should be noted that when a three-pole jack is inserted into the socket for receiving a four-pole jack, the control node would be shorted to GND to be at 0V. Therefore, any switch closure should generate a minimum control voltage that is appreciably different from GND. In this preferred embodiment, the lowest voltage generated when a switch is closed for a device powered by a fully charged battery of 3.3V is about 0.2V. The values of resistors R1–R5 are chosen such that the voltages generated at the control node fall in the range of 0.2V to 1.0V. Preferably, the generated voltages are sufficiently spaced in the range to cater for tolerances in the values of the resistors. The control voltages for a fully charged battery at 3.3V are given in the table below.

| Closure of Switch | Voltage at control node |
| --- | --- |
| None | 3.3 V |
| S5 (RECORD) | 0.2 V |
| S4 (PLAY) | 0.4 V |
| S3 (STOP) | 0.6 V |
| S2 (FORWARD) | 0.8 V |
| S1 (BACKWARD) | 1.0 V |

These voltage values are stored in the memory (not shown) in the device 4 and used for subsequent comparison with a measured voltage at the control node for determining which switch is closed. Since the battery voltage drops with usage, more than one set of these voltages that correspond to different battery voltages may be required. Take as an example when the battery level has dropped to 2.8V. At such a battery level, closure of the switch S1 will result in a voltage of approximately 0.8V to be dropped at the control node 14. If the microprocessor 17 relies only on a single set of voltage values (as shown in the table above) to determine which switch is closed, it would erroneously determine that the switch S2 is closed instead of the switch S1. Therefore when the battery voltage is at 2.8V, a different set of predetermined voltages is required for determination of switch closure.

Connected across the resistor R6 is a resistor R7 in series with a switch such as a MOSFET 15. When the switch S5 is closed during a recording session, the voltage at the control node is held at about 0.2V. This biasing voltage is not sufficient to allow maximum swing of an audio-frequency signal received from the microphone 12. A negative-going portion of the audio-frequency signal will be clipped. Such clipping of the signal results in undesirable distortion when the signal is reproduced. It is therefore important to raise the voltage at the control node 14 to a level which allows the audio-frequency signal to attain its maximum swing in both directions of the bias voltage. In the preferred embodiment, the biasing voltage is raised to about half of the battery voltage by switching the resistor R7 across R6 to reduce the overall resistance across resistor R6. The MOSFET 15 is switched on and off to connect and disconnect resistor R7 from resistor R6. The gate of the MOSFET 15 is connected to an output pin of the microprocessor to allow the microprocessor 17 to switch the MOSFET 15 on and off.

Figure 3:
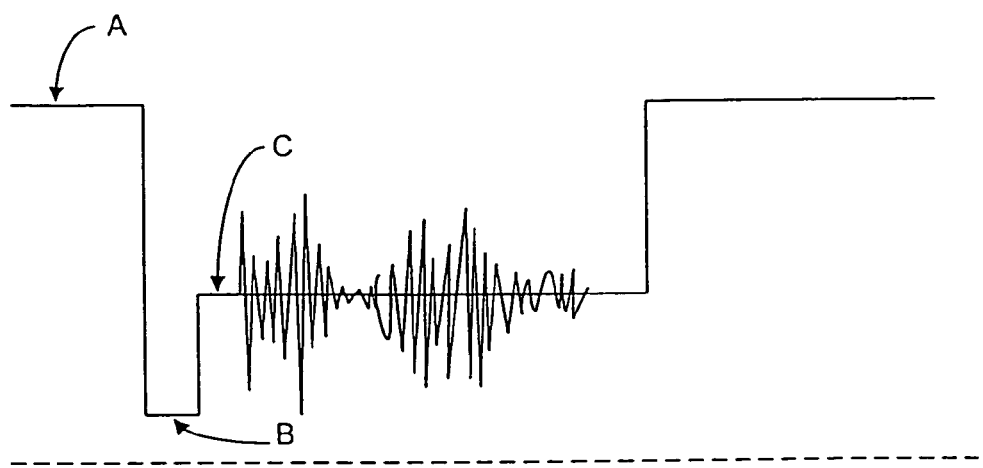
FIG. 3 is a graph of the voltage at the control node during a recording session using the P/PC in FIG. 1.
Figure 4:
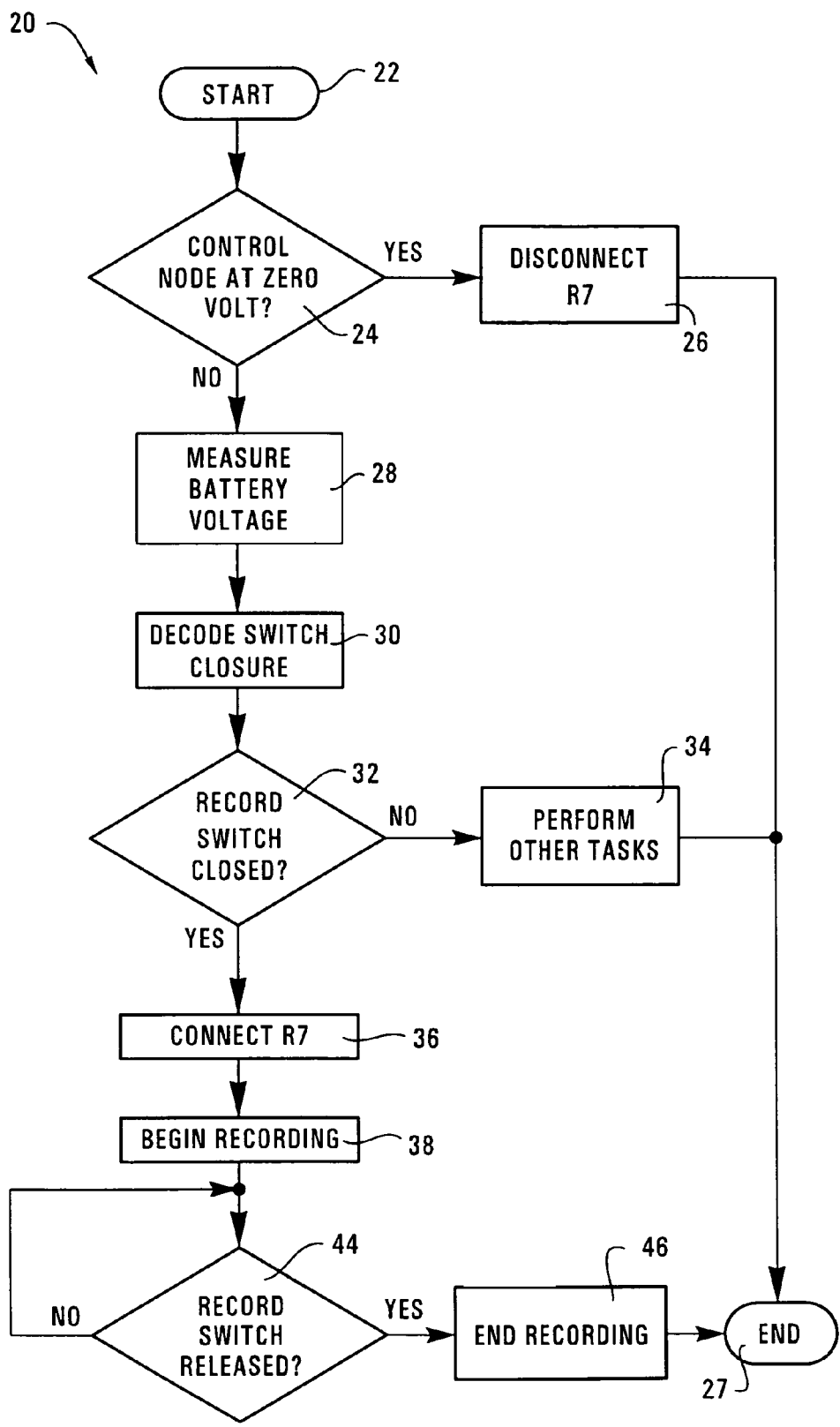
FIG. 4 is a sequence of steps for decoding the closure of the switches in FIG. 2 and for adjusting the voltage at the control node when it is detected that the switch associated with a recording function is closed.

FIG. 3 is a graph showing the voltage at the control node 14 during a recording session. This graph is best described in conjunction with a description of a sequence of steps for detecting switch closures that is implemented in an interrupt handler. FIG. 4 is a flowchart of the sequence 20 of steps. The sequence 20 begins in a START step 22 when a switch is closed to cause an interrupt to occur in the microprocessor. The microprocessor 17 executes the interrupt handler associated with the I/O pin to which the control node 14 is connected. Before the switch is closed, the control node is pulled high by the resistor R6 and the control voltage is at the battery voltage. This voltage at the control node 14 is indicated by arrow A in FIG. 3. After the START step 22, the sequence 20 proceeds to a CONTROL VOLTAGE AT ZERO VOLTAGE? step 24, where a comparator compares the analog control voltage with predetermined values to determine which switch is closed. In this preferred embodiment, the microprocessor performs a comparator function by converting the analog control node voltage to a digital value and determining if that value is close to or equal to zero volt. An on-chip analog-to-digital converter (ADC) in the microprocessor preferably performs this conversion. If it is determined in this step that the control voltage is close to or equal to zero volt, the sequence 20 proceeds to a DISCONNECT R7 step 26. In this step 26, the microprocessor 17 switches the MOSFET 15 off to disconnect resistor R7 from resistor R6 to allow resistor R6 to limit the current drain from the battery as previously described. The sequence 20 then proceeds to an END step 27, where the microprocessor may optionally return to a power saving mode.

If however it is determined in the CONTROL VOLTAGE AT ZERO VOLT? step 24 that the control voltage is not close to or equal to zero volt, the sequence 20 proceeds to a MEASURE BATTERY VOLTAGE step 28, where the microprocessor determines the battery voltage. The sequence then proceeds to a DECODE SWITCH CLOSURE step 30, where the microprocessor compares the digital voltage value against an appropriate set of voltages corresponding to the measured battery voltage to determine which of the several switches S1–S5 are closed. The sequence next proceeds to a RECORD SWITCH CLOSED? step 32, where the microprocessor determines if it is the switch S5 that is closed. If it is determined that it is not the switch S5 that is closed, the microprocessor proceeds to a PERFORM OTHER TASKS step 34. In this step, the interrupt handler calls the appropriate software routine that implements the activated function associated with a highest priority closed switch to perform the function.

If it is determined in the RECORD SWITCH CLOSED? step 32 that the switch S5 is closed—when the voltage at the control node is about 0.2V—the sequence 20 proceeds to a CONNECT R7 steps 36. An arrow B in FIG. 3 indicates this control node voltage when switch S5 is closed. In the CONNECT R7 step 36, the microprocessor turns the MOSFET 15 on to connect resistor R7 across resistor R6. This connection changes the resistance across resistor R6 in the voltage divider and as a result, raises the control node voltage to about half of the battery voltage. An arrow C in FIG. 3 indicates this raised voltage at the control node 14. The sequence then proceeds to a BEGIN RECORDING step 38. In this step, a user can begin to speak into the microphone 12. The microphone converts the speech into an audio-frequency signal. This signal is appropriately biased to allow maximum swing of the signal in either direction of the bias voltage. As the peak-to-peak voltage of this audio-frequency signal is small, it is preferable that the signal be amplified using an audio pre-amplifier 40 (FIG. 2). The amplified signal at the output of the pre-amplifier 40 is then subsequently digitally coded by a CODEC 42 (FIG. 2). The coded values from the CODEC 42 are then stored in the memory of the device 4 for subsequent retrieval.

The sequence 20 next proceeds to a RECORD SWITCH RELEASED? STEP 44. In this step, the microprocessor 17 determines if the closed switch S5 is released by either polling the I/O pin or by interrupt means associated with the pin. If it is determined that the closed switch S5 is not released, the sequence loops around this step 44. If however it is determined that the closed switch S5 is released, the sequence proceeds to an END RECORDING step 46, where the interrupt handler terminates the recording session. When the closed switch S5 is released, the voltage at the control node is also pulled up to the battery voltage by the resistor R6. The sequence finally terminates in the END step 27, where the microprocessor can optionally disconnect resistor R7 from across resistor R6 by turning the MOSFET off.

Figure 5:
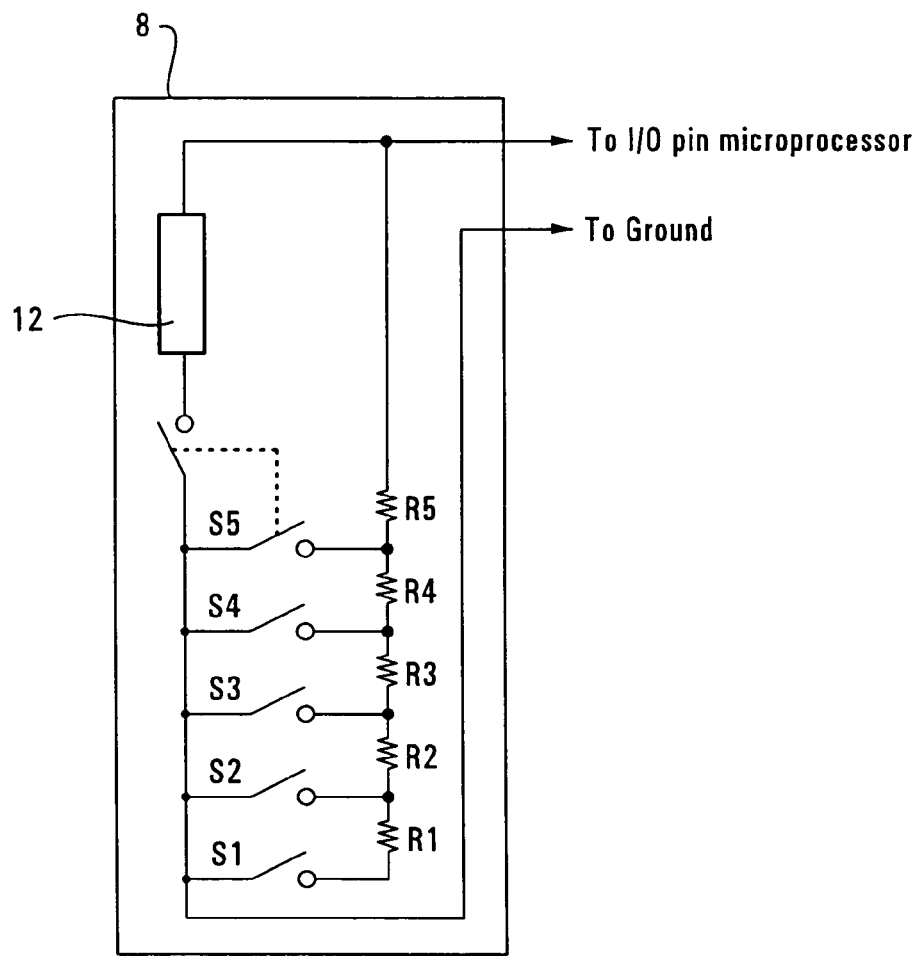
FIG. 5 is an alternative embodiment of the remote control of the present invention.

While the present invention has been shown and described with reference to the foregoing operational principles and preferred embodiment, it will be apparent to those skilled in the art that other changes in form and detail may be made. As an example, the microphone 12 may be connected in parallel to the resistor R1–R5 instead of the series connection in the preferred embodiment. FIG. 5 shows a microphone 12 connected in parallel to the resistors R1–R5.

The switch S5 in this alternative embodiment is of a double-pole-single-throw type. When actuated, this switch S5 connects the resistors R5 and the microphone 12 to a ground signal in the device 4. When connected in this manner, the microphone 12 does not affect the voltage at the microprocessor pin when the switches S1–S4 are actuated. Such a configuration allows a higher tolerance in the resistance values of the resistors R1–R5. As a result, switch closure can be more accurately determined.

We claim:

1. Apparatus for detecting the closure of one of a plurality of switches using a single input line of a detector, the apparatus comprising:
a voltage generator configured to be responsive to a switch closure for generating an output voltage on the input line; the output voltage being one of a plurality of predetermined voltages depending on which one of the plurality of switches is closed, wherein the voltage generator comprises a voltage divider having:
a first resistance; and
a second resistance electrically coupled to the first resistance at a control node,
the second resistance comprising a network of resistors connected in series and electrically coupled to the plurality of switches:
a microphone for converting sound received thereat to audio-frequency signals on the input line, the microphone being electrically coupled in series with the second resistance of the voltage generator;
a comparator in the detector receiving the output voltage on the input line and for determining which one of the plurality of switches is closed; and
a storage means for storing audio-frequency signals on the input line when one of the switches designated as a recording function switch is detected to be closed.

2. The apparatus according to claim 1, wherein the second-resistance each of the plurality of switches is associated with a corresponding number of resistors in the series of resistors and wherein the switch designated as a recording function switch is associated with the least number of resistors.

3. The apparatus according to claim 1, further comprising amplifying means electrically coupled to the input line for amplifying the audio-frequency signal and wherein the storage means stores the amplified audio-frequency signal.

4. The apparatus according to claim 1, further comprising:
a coding means for digitally encoding the amplified audio-frequency signal to a coded signal; and
wherein the comparator includes an analog-to-digital converter for converting the output voltage from the voltage generator to a digital voltage value; and
a microprocessor for comparing the digital voltage value with a set of predetermined values to determine which one of the plurality of switches is closed and for enabling the storage means to store the coded signal.

5. The apparatus according to claim 4, further comprising:
a first casing for housing the voltage generator and the microphone;
a second casing for housing the microprocessor, the amplifying means, the coding means and the storage means; and
a coupling means for electrically coupling the microphone to the comparator, wherein the coupling means includes the input line.

6. The apparatus according to claim 1, wherein the comparator comprises:
an analog-to-digital converter for converting the output voltage from the voltage generator to a digital voltage value; and
a microprocessor for comparing the digital voltage value with a set of predetermined values to determine which one of the plurality of switches is closed.

7. The apparatus according to claim 1,
wherein the control node is electrically coupled to the input line and the network of resistors can be selectively switched out of the voltage divider by closure of the plurality of switches to change the second resistance in the voltage divider.

8. The apparatus according to claim 7, further comprising a third resistance which can be switched to be electrically coupled across the first resistance to produce a lower overall resistance across the first resistance, when the recording function switch is closed, so as to appropriately bias the microphone.

9. A remote control and earphones set for connection to an audio recording and playback device, the device having a four-pole socket which is electrically coupled to an audio circuit in the device for delivering a left and a right channel audio-frequency signal, a ground connection and a circuit for receiving an external control signal from a control line, the control line being pulled high by a pull-up resistor in the device, the remote control and earphones set comprising:
   a four-pole jack for connecting to the four-pole socket of the device;
   a remote control coupled to the four-pole jack, the remote control having:
   a resistance formed by a network of resistors, wherein the resistors are connected in series;
   a plurality of switches electrically coupled to the network of resistors from the resistance, the closure of each switch denoting the activation of one of a set of audio operations, the set of audio operations comprising recording and playback, wherein each of the plurality of switches is associated with a corresponding number of resistors in the series or resistors and wherein the switch denoting the activation of a recording audio operation is associated with the least number of resistors; and
   a microphone electrically coupled at one end to the control line and at the other end to the resistance for converting received sound to an audio-frequency signal onto the control line during recording, the resistance and the microphone cooperating with the pull-up resistor to form a voltage divider;
   a pair of earphones electrically coupled to the four-pole jack for receiving the audio-frequency signals during playback; and
   whereby the closure of each switch leaves a different number of resistors in the resistance in the voltage divider to produce a predetermined voltage on the control line for the device to identify which switch is closed.

10. A remote control and earphones set according to claim 9, wherein the network of resistors are connected interconnection nodes and the plurality of switches are electrically coupled to the resistance with one end of each switch electrically coupled to an interconnection node and the other end of each switch electrically coupled to ground.

11. A remote control and earphones set according to claim 10, wherein microphone is connected in series with the resistance.

12. A remote control and earphones set according to claim 9, wherein the remote control is directly coupled to the four-pole jack and the earphones are coupled to the four-pole jack via the remote control.

13. A method of detecting the closure of one of a plurality of switches which is coupled to a single input line of a microprocessor in a device powered by a battery source, the device being operable over a range of battery levels of the battery source, the method comprising:
   generating a predetermined voltage, which is dependent on the battery level, at the input line when a switch in the plurality of switches is closed;
   converting the predetermined voltage received on the input line to a digital voltage value;
   measuring the battery level by converting an analog battery level to a digital value;
   selecting a set of predetermined voltage values corresponding to the digital value of the battery level; and
   comparing the digital voltage value with the selected set of predetermined voltage values to determine which of the plurality of switches is closed.

14. A method according to claim 13; further comprising interrupting the microprocessor when a switch is closed.

15. A method according to claim 13, wherein the input line is further coupled to a microphone for receiving an audio-frequency signal therefrom and the plurality of switches are for activating a set of audio functions comprising recording, playing back, stopping, forwarding and reversing on the device, the method further comprising changing the voltage on the input line during recording to appropriately bias the microphone such that a received audio-frequency signal is substantially undistorted.

16. A method according to claim 15, further comprising: amplifying the audio-frequency signal to produce an amplified signal; and storing the amplified signal.

17. A method according to claim 16, further comprising: coding the amplified signal to produce a coded signal; and storing the coded signal.

18. Apparatus for detecting the closure of one of a plurality of switches using a single input line of a detector, the apparatus comprising:
   a voltage generator configured to be responsive to a switch closure for generating an output voltage on the input line, the output voltage being one of a plurality of predetermined voltages depending on which one of the plurality of switches is closed, wherein the voltage generator comprises a voltage divider having:
   a first resistance; and
   a second resistance electrically coupled to the first resistance at a control node,
   the second resistance comprising a network of resistors connected in series and electrically coupled to the plurality of switches;
   a microphone, electrically coupled in series with the second resistance of the voltage generator, for converting sound received thereat to audio-frequency signals on the input line;
   a pair of earphones electrically coupled to the input line for receiving the audio-frequency signals during playback;
   a comparator in the detector for receiving the output voltage on the input line and for determining which one of the plurality of switches is closed; and
   a storage means that is activated for storing audio-frequency signals on the input line when one of the switches designated as a recording function switch is detected to be closed.

19. A remote control and earphones set for connection to an audio recording and playback device, the device having a four-pole socket which is electrically coupled to an audio circuit in the device for delivering a left and a right channel audio-frequency signal, a ground connection and a circuit for receiving a external control signal from a control line, the control line being pulled high by a pull-up resistor in the device, the remote control and earphones set comprising:
   a four-pole jack for connecting to the four-pole socket of the device;
   a remote control coupled to the four-pole jack, the remote control having:
   a resistance formed by a network of resistors wherein the resistance cooperates with the pull-up resistor to form a voltage divider, wherein the resistors in the network of resistors are connected in series;
   a plurality of switches electrically coupled to the network of resistors from the resistance, the closure of each switch denoting the activation of one of a set of audio operations, the set of audio operations comprising recording and playback, wherein each of the plurality of switches is associated with a corresponding number of resistors in the series of resistors and wherein the switch, denoting the activation of a recording audio operation is associated with the least number of resistance;

a microphone, switchably connectable across at least one resistor of the resistance via a microphone on/off switch, for converting received sound to an audio-frequency signal onto the control line during recording; and a pair of earphones electrically coupled to the four-pole jack for receiving the audio-frequency signals during playback; and whereby the closure of each switch leaves a different number of resistors in the resistance in the voltage divider to produce a predetermined voltage on the control line for the device to identify which switch is closed, and wherein the microphone on/off switch and one of the switches designated a recording function switch is a common double-pole-single-throw switch configured such that the microphone is switched across the at least one resistor when the recording function switch is closed.

20. A method of detecting the closure of one of a plurality of switches which is coupled to a single input of a microprocessor in a device powered by a battery source, the device being operable over a range of battery levels of the battery source, the method comprising:

generating a predetermined voltage, that is dependent on the battery level, at the input line when a switch in the plurality of switches is closed, wherein each of the plurality of switches is associated with a corresponding number of resistors in a series of resistors;

activating a microphone electrically coupled in series with the resistors when the switch associated with the smallest number of resistors is closed;

converting the predetermined voltage received on the input line is a digital voltage value;

measuring the battery level by converting an analog battery level to a digital value based on a fixed reference voltage obtained from the battery;

selecting a set of predetermined voltage values corresponding to the digital value of the battery level; and comparing the digital voltage value with the selected set of predetermined voltage values to determine which of the plurality of switches is closed.

21. A method of detecting the closure of one of a plurality of switches which is coupled to a single input line of a microprocessor in a device powered by a battery source, the device being operable over a range of battery levels of the battery source, the method comprising:

coupling a microphone to the input line;

generating a predetermined voltage at the input and interrupting a microprocessor when a switch in the plurality of switches is closed; and under the instruction of the microprocessor, converting the predetermined voltage received on the input line to a digital voltage value;

measuring the battery level;

selecting a set of predetermined voltages corresponding to the battery level;

comparing the digital voltage value with the selected set of predetermined voltages to determine which of the plurality of switches is closed; and changing the voltage on the input line to appropriately bias the microphone such that an audio-frequency signal received from the microphone is at least substantially undistorted when it is determined that one of plurality of switches designated as a recording function switch is closed.

* * * * *

UNITED STATES PATENT AND TRADEMARK OFFICE
CERTIFICATE OF CORRECTION

PATENT NO.     : 6,970,752 B1
DATED          : November 29, 2005
INVENTOR(S)    : Teck Chye Allen Lim et al.

It is certified that error appears in the above-identified patent and that said Letters Patent is hereby corrected as shown below:

Column 8,
Lines 19-20, "wherein the second-resistance each of the plurality" should read
-- wherein each of the plurality --;

Column 9,
Lines 41-42, "connected interconnection nodes" should read -- connected at interconnection nodes --;

Column 10,
Line 55, "a external control signal" should read -- an external control signal --.

Signed and Sealed this

Twenty-first Day of February, 2006

JON W. DUDAS
*Director of the United States Patent and Trademark Office*